United States Patent
Dai et al.

(10) Patent No.: US 12,313,694 B2
(45) Date of Patent: May 27, 2025

(54) METHOD FOR DIAGNOSING INTERNAL SHORT CIRCUIT OF BATTERY BASED ON RELAXATION VOLTAGE

(71) Applicant: Tongji University, Shanghai (CN)

(72) Inventors: Haifeng Dai, Shanghai (CN); Xuezhe Wei, Shanghai (CN); Xueyuan Wang, Shanghai (CN); Guangxu Zhang, Shanghai (CN)

(73) Assignee: TONGJI UNIVERSITY, Shanghai (CN)

( * ) Notice: Subject to any disclaimer, the term of this patent is extended or adjusted under 35 U.S.C. 154(b) by 856 days.

(21) Appl. No.: 17/613,660

(22) PCT Filed: Jan. 22, 2021

(86) PCT No.: PCT/CN2021/073275
§ 371 (c)(1),
(2) Date: Nov. 23, 2021

(87) PCT Pub. No.: WO2021/238247
PCT Pub. Date: Dec. 2, 2021

(65) Prior Publication Data
US 2022/0236338 A1      Jul. 28, 2022

(30) Foreign Application Priority Data
May 26, 2020    (CN) .......................... 202010456801.4

(51) Int. Cl.
*G01R 31/396*       (2019.01)
*G01R 31/3835*      (2019.01)
(Continued)

(52) U.S. Cl.
CPC ....... *G01R 31/396* (2019.01); *G01R 31/3835* (2019.01); *G01R 31/52* (2020.01); *H02J 7/0068* (2013.01)

(58) Field of Classification Search
CPC .. G01R 31/396; G01R 31/3835; G01R 31/52; G01R 31/367; G01R 31/389; H02J 7/0068
See application file for complete search history.

(56) References Cited

U.S. PATENT DOCUMENTS

| | | | |
|---|---|---|---|
| 2007/0145953 A1* | 6/2007 | Asai ..................... | G01R 31/367 320/149 |
| 2016/0103185 A1* | 4/2016 | Chang ................ | G01R 31/3835 324/429 |

(Continued)

FOREIGN PATENT DOCUMENTS

| | | |
|---|---|---|
| CN | 104617330 A | 5/2015 |
| CN | 104835987 A | 8/2015 |

(Continued)

OTHER PUBLICATIONS

English machine translation of KR101743556B1 (Year: 2017).*
International Search Report mailed Apr. 22, 2021 in corresponding PCT application No. PCT/CN2021/073275.

*Primary Examiner* — Walter L Lindsay, Jr.
*Assistant Examiner* — Geoffrey T Evans
(74) *Attorney, Agent, or Firm* — Nields, Lemack & Frame, LLC

(57) ABSTRACT

The present disclosure provides a method for diagnosing an internal short circuit of a battery based on a relaxation voltage, including: 1) acquiring a relaxation voltage curve of each cell in a battery after a current is unloaded under same conditions of the battery; 2) extracting features from the relaxation voltage curve of each cell to obtain corresponding curve features; and 3) determining whether the internal short circuit occurs in the cell according to curve features, thereby completing diagnosis. The present disclosure has the advantages of short detection time and high accuracy over the prior art.

8 Claims, 5 Drawing Sheets

(51) Int. Cl.
  *G01R 31/52* (2020.01)
  *H02J 7/00* (2006.01)

(56) References Cited

U.S. PATENT DOCUMENTS

2019/0176639 A1    6/2019  Kumar et al.
2019/0326650 A1*  10/2019  McCoy ............. G01R 31/3835

FOREIGN PATENT DOCUMENTS

| CN | 107192914 A  |   9/2017 | |
|----|--------------|----------|---|
| CN | 109901075 A  |   6/2019 | |
| CN | 110515012 A  |  11/2019 | |
| CN | 111551860 A  |   8/2020 | |
| JP | 2014-2009 A  |   1/2014 | |
| KR | 101743556 B1 * | 6/2017 | ............ H01M 6/166 |

* cited by examiner

METHOD FOR DIAGNOSING INTERNAL SHORT CIRCUIT OF BATTERY BASED ON RELAXATION VOLTAGE

CROSS REFERENCE TO RELATED APPLICATION

The present application claims priority to the Chinese Patent Application No. 202010456801.4, filed with the China National Intellectual Property Administration (CNIPA) on May 26, 2020, and entitled "METHOD FOR DIAGNOSING INTERNAL SHORT CIRCUIT OF BATTERY BASED ON RELAXATION VOLTAGE", which is incorporated herein by reference in its entirety.

TECHNICAL FIELD

The present disclosure relates to the field of battery fault diagnosis, and in particular, to a method for diagnosing an internal short circuit of a battery based on a relaxation voltage.

BACKGROUND ART

Lithium-ion batteries (LIBs) are widely applied to vehicles, electronic products and energy storage power stations for advantages such as a high specific energy density and a long cycle life. However, safety accidents of the LIBs have occurred frequently and are mainly arising from internal short circuits. There are many reasons contributing to the internal short circuits of the LIBs, including manufacturing defects, mechanical abuse, electrical abuse and thermal abuse. The internal short circuits may occur at any time during the full life cycle of the batteries and are likely to cause serious safety accidents due to thermal runaway. Therefore, the internal short circuits need to be diagnosed timely for early warning, to ensure the safety of life and property.

In the conventional art, the internal short circuit is typically detected based on a threshold, that is, whether the internal short circuit occurs is determined by detecting whether a voltage difference, a current difference or a temperature difference is more than a set threshold. However, existing methods for detecting the internal short circuit require a long detection time, and they are vulnerable to external interference, and the detection results thereof depend on the threshold setting, which causes poor detection accuracy and undesirable diagnosis effect.

SUMMARY

An objective of the present disclosure is to provide a method for diagnosing an internal short circuit of a battery based on a relaxation voltage, to overcome the defects of the conventional art.

The objective of the present disclosure can be achieved by the following technical solutions:

A method for diagnosing an internal short circuit of a battery based on a relaxation voltage includes:

1) acquiring a relaxation voltage curve of each cell in a battery after a current is unloaded, under same conditions of the battery;
2) extracting features from the relaxation voltage curve of each cell to obtain corresponding curve features; and
3) determining whether an internal short circuit occurs in the cell according to the curve features, thereby completing diagnosis.

The same conditions of the battery in step 1) may specifically refer to a same state of charge (SOC), temperature, current rate and state of health (SOH).

The current rate may be calculated according to a current flowing through the cell before completion of battery charging/discharging.

The curve features of the relaxation voltage curve in step 2) may include a relaxation voltage difference and a relaxation voltage differential curve.

The relaxation voltage difference may be obtained by performing a subtraction on relaxation voltages between adjacent cells:

$$\Delta V_{k-1} = |V_k - V_{k-1}|, k = 2, 3, 4...$$

where, $\Delta V_{k-1}$ is a difference between a relaxation voltage $V_k$ of a kth cell and a relaxation voltage $V_{k-1}$ of a (k−1)th cell;

where, whether the internal short circuit occurs in the cell is determined according to the relaxation voltage difference by:

determining, if a corresponding relaxation voltage difference $\Delta V_m$ between an mth cell and an (m+1)th cell is maximum, i.e., $\Delta V_{max} = \Delta V_m$, a corresponding relaxation voltage difference $\Delta V_w$ between a wth cell and a (w+1)th cell is minimum, i.e., $\Delta V_{min} = \Delta V_w$, and $\Delta V_{max} \geq 1.3 \Delta V_{min}$, that the internal short circuit occurs in the mth or (m+1)th cell in a circuit; and determining, by comparing relaxation voltage differences $\Delta V_{m-1}$ and $\Delta V_{m+1}$, a cell where the internal short circuit occurs, where it is determined that the internal short circuit occurs in the mth cell if $\Delta V_{m-1} > \Delta V_{m+1}$, and the internal short circuit occurs in the (m+1)th cell if $\Delta V_{m-1} < \Delta V_{m+1}$.

The relaxation voltage differential curve may be obtained by performing a differential operation on the relaxation voltage curve of each cell, and whether an internal short circuit occurs in a cell may be determined according to the relaxation voltage differential curve by:

acquiring differences $$\left(\frac{dV}{dt}\right)_{k+1} \text{ and } \left(\frac{dV}{dt}\right)_k$$

of relaxation voltage differentials of the cell at a (k+1)th time and a kth time;

determining, after the completion of the battery charging, that the internal short circuit does not occur in the cell if $$\left(\frac{dV}{dt}\right)_{k+1} - \left(\frac{dV}{dt}\right)_k > 0,$$

and the internal short circuit occurs in the cell if $$\left(\frac{dV}{dt}\right)_{k+1} - \left(\frac{dV}{dt}\right)_k < 0;$$

and determining, after the discharging, that the internal short circuit does not occur in the cell if $$\left(\frac{dV}{dt}\right)_{k+1} - \left(\frac{dV}{dt}\right)_k < 0,$$

and the internal short circuit occurs in the cell if $$\left(\frac{dV}{dt}\right)_{k+1} - \left(\frac{dV}{dt}\right)_k > 0.$$

The relaxation voltage in step 1) may specifically refer to a voltage change from a current unloading time to a stable open-circuit state, and may be used to indicate a recoverability of the battery after the current is unloaded.

The method may further include:

4) predicting a relaxation voltage curve of each cell, and
5) determining, if the internal short circuit does not occur in the cell currently, whether the internal short circuit occurs in the cell in future according to curve features extracted from the predicted relaxation voltage curve of the cell.

The relaxation voltage curve may be predicted with a nonlinear prediction method in step 4).

The nonlinear prediction method may include an extended Kalman filter (EKF) algorithm and a recursive least squares (RLS) algorithm.

The present disclosure has the following advantages over the conventional art:

First, according to the method for diagnosing an internal short circuit based on a feature change of a relaxation voltage of a battery provided by the present disclosure, the relaxation voltage is a description on the "recoverability" of the battery after the current is unloaded, and the change of the relaxation voltage is sensitive to an internal state of the battery and can reflect the state of the internal short circuit sensitively.

Second, the present disclosure predicts the relaxation voltage of the battery and can predict its future change through changes of relaxation voltages of few cells, which shortens the acquisition time of the relaxation voltage.

Third, the present disclosure reduces the interference from external noise and improves the prediction accuracy with the use of the nonlinear prediction algorithm such as the EKF algorithm and the RLS algorithm.

Fourth, the present disclosure performs extraction, fusion and analysis on the feature of the relaxation voltage curve of each cell under the special SOC, temperature, current and SOH of the battery, and can better reflect the true state of the internal short circuit in combination with multiple evaluations.

Fifth, the present disclosure can predict whether the internal short circuit occurs in the battery in future, thereby greatly shortening the detection time.

DETAILED DESCRIPTION OF THE EMBODIMENTS

The following descriptions are further made to the method for diagnosing an internal short circuit of a battery based on a relaxation voltage in combination with the accompanying drawings and specific embodiments. It should be noted that the embodiments in the present disclosure or features in the embodiments may be combined in a non-conflicting manner.

Terms mentioned in the embodiments of the present disclosure have the following explanations:

Internal short circuit: It refers to an abnormal pathway in which positive and negative electrodes of the battery are directly connected or indirectly connected via other foreign matters.

Relaxation voltage: It is a voltage change from a current unloading time to a stable open-circuit state, and an external form for a balance in the battery. The relaxation voltage is a description on the "recoverability" of the battery after the current is unloaded, the essence of which is to take the recoverability of the battery as an evaluation on the SOH, SOC and impedance state of the battery as well as external current and temperature, establish a relation with other evaluations (such as the capacity and the internal resistance) and evaluate a state of the battery with a recoverability value. Therefore, the change of the relaxation voltage is sensitive to the internal state of the battery.

Figure 1:
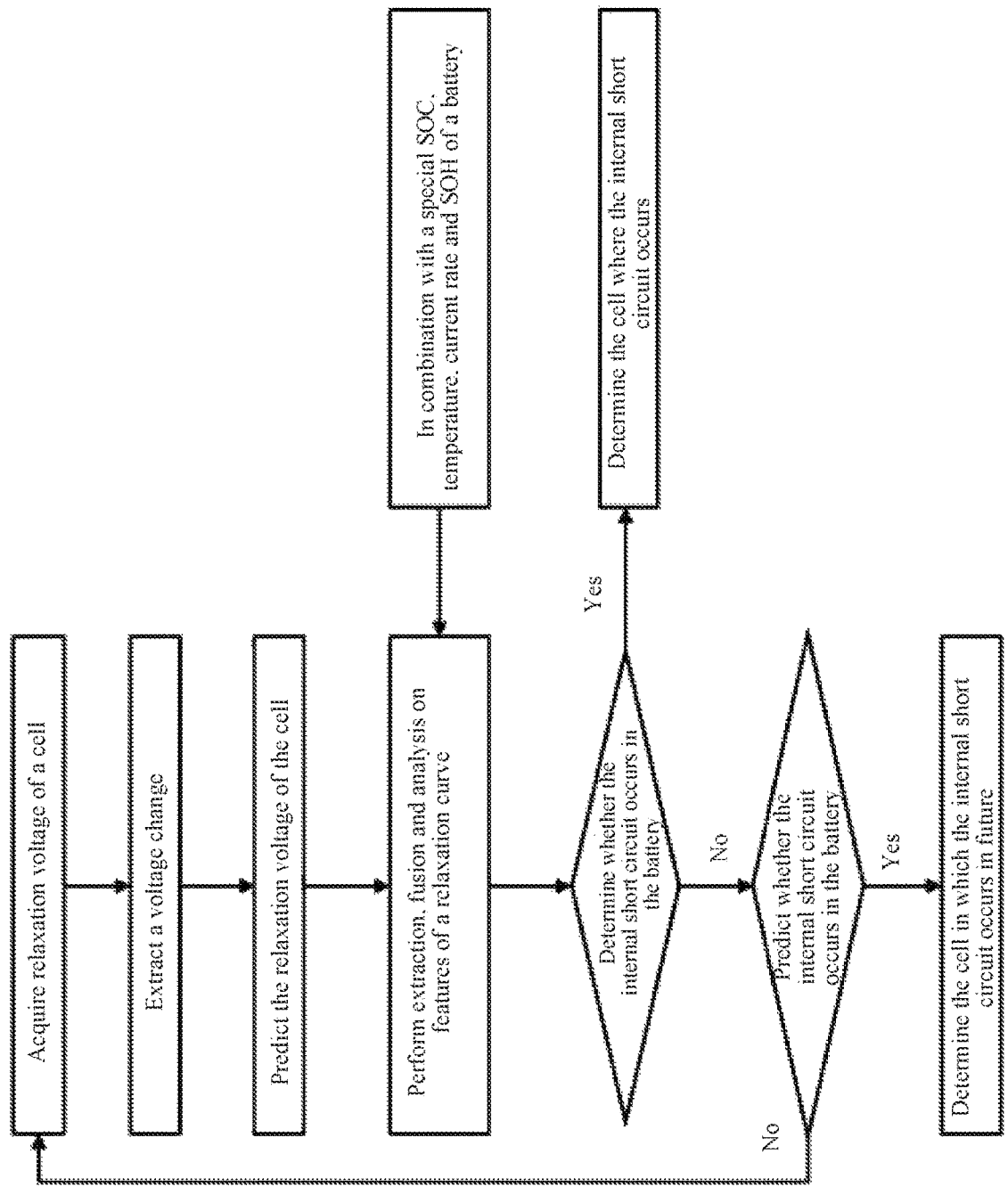
FIG. 1 shows an overall flow chart according to the present disclosure.

FIG. 1 shows an overall flow chart of a method for diagnosing an internal short circuit according to the present disclosure. The method for diagnosing an internal short circuit provided by the present disclosure is the method for diagnosing an internal short circuit based on a relaxation voltage of a battery. The relaxation voltage is the external form for the internal state of the battery, and can accurately reflect a subtle change for the internal state of the battery. When the short circuit occurs in the battery, the original state in the battery is broken. The relaxation voltage of the battery changes with the internal state of the battery. Therefore, whether the internal short circuit occurs in the battery can be accurately determined through analysis on a change feature of the relaxation voltage of the battery.

The specific process in the embodiment is as follows:

1) An LIB is selected, where one LIB cell is connected in parallel with a resistor having a special resistance, and is considered as a cell in which an internal short circuit have already occurred.
2) The cell with the internal short circuit is connected in series to multiple normal LIB cells.
3) The battery pack connected in series is charged at a constant current and stopped charging after a period of time.
4) A current of the cell before the completion of charging, and a relaxation voltage, an SOC, a temperature and an SOH after the completion of charging are acquired.
5) Features of a relaxation voltage curve of the cell, i.e., a relaxation voltage difference and a relaxation voltage differential curve, are extracted.

Figure 3:
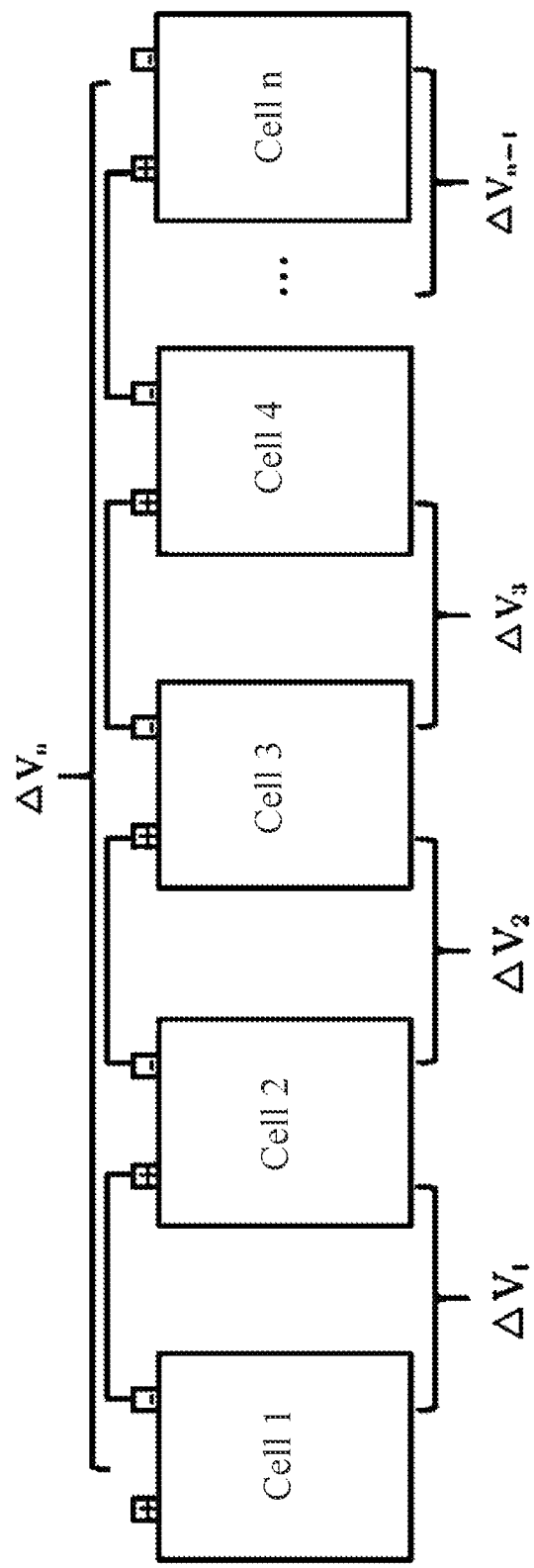
FIG. 3 shows a schematic view of a relaxation voltage difference according to an embodiment of the present disclosure.

Where, the relaxation voltage difference is obtained by calculating relaxation voltages of adjacent cells: $\Delta V_{k-1} = |V_k - V_{k-1}|$, k=2, 3, 4 . . . , where $V_k$ is a relaxation voltage of a kth cell, and $\Delta V_{k-1}$ is a difference between the relaxation voltage of the kth cell and a relaxation voltage of a (k−1)th cell, as shown in FIG. 3.

Figure 4:
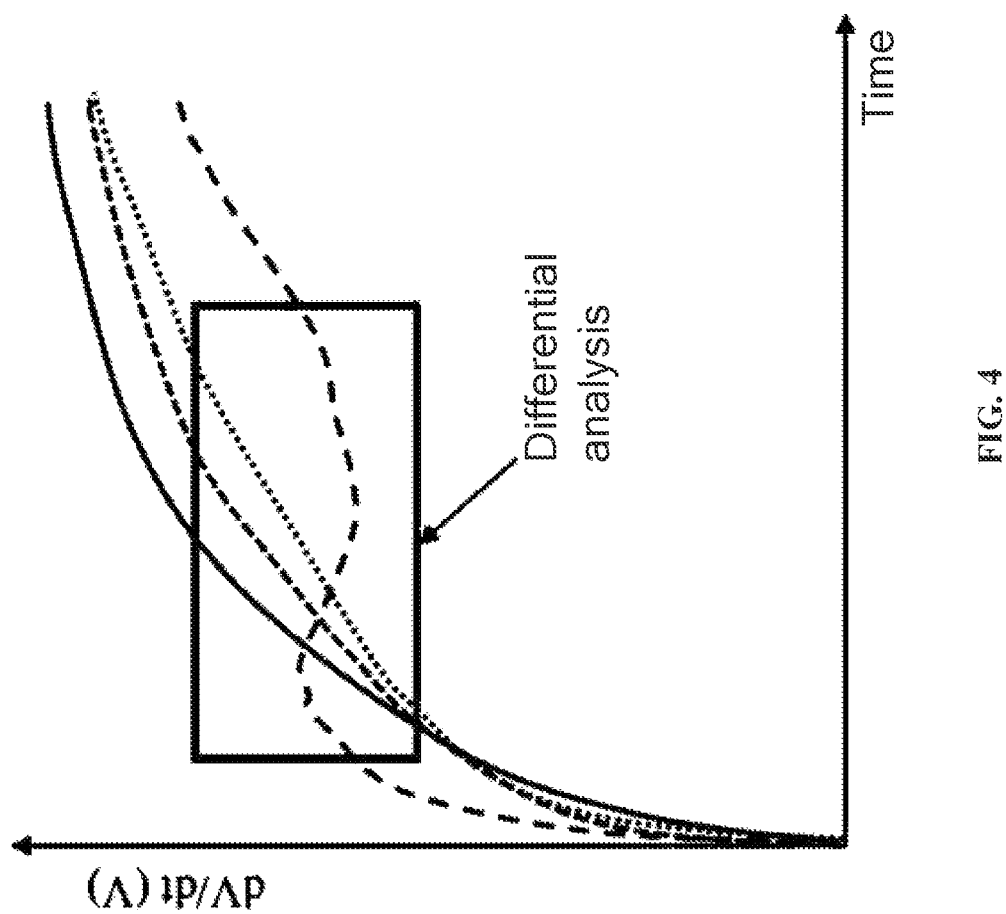
FIG. 4 shows a schematic view of a relaxation voltage differential curve according to an embodiment of the present disclosure.

The relaxation voltage differential curve is obtained by performing a differential calculation on the relaxation voltage curve of each cell. In order to simplify the calculation, a differential method is used:

$$\frac{dV}{dt} = \frac{|V_n - V_{n-1}|}{\Delta t}$$

where, for each cell, $V_n$ is a relaxation voltage of the cell acquired at an nth time, $V_{n-1}$ is a relaxation voltage of the cell acquired at an (n−1)th time, $\Delta t$ is a time interval for acquiring the relaxation voltages $V_n$ and $V_{n-1}$ of the cell, and $$\frac{dV}{dt}$$

is a calculated differential for the relaxation voltage of the cell, as shown in FIG. 4.

6) Whether the internal short circuit occurs is determined according to the curve features of the relaxation voltage of the cell, and a relaxation voltage of the cell is predicted with an EKF algorithm or an RLS algorithm.

Figure 5:
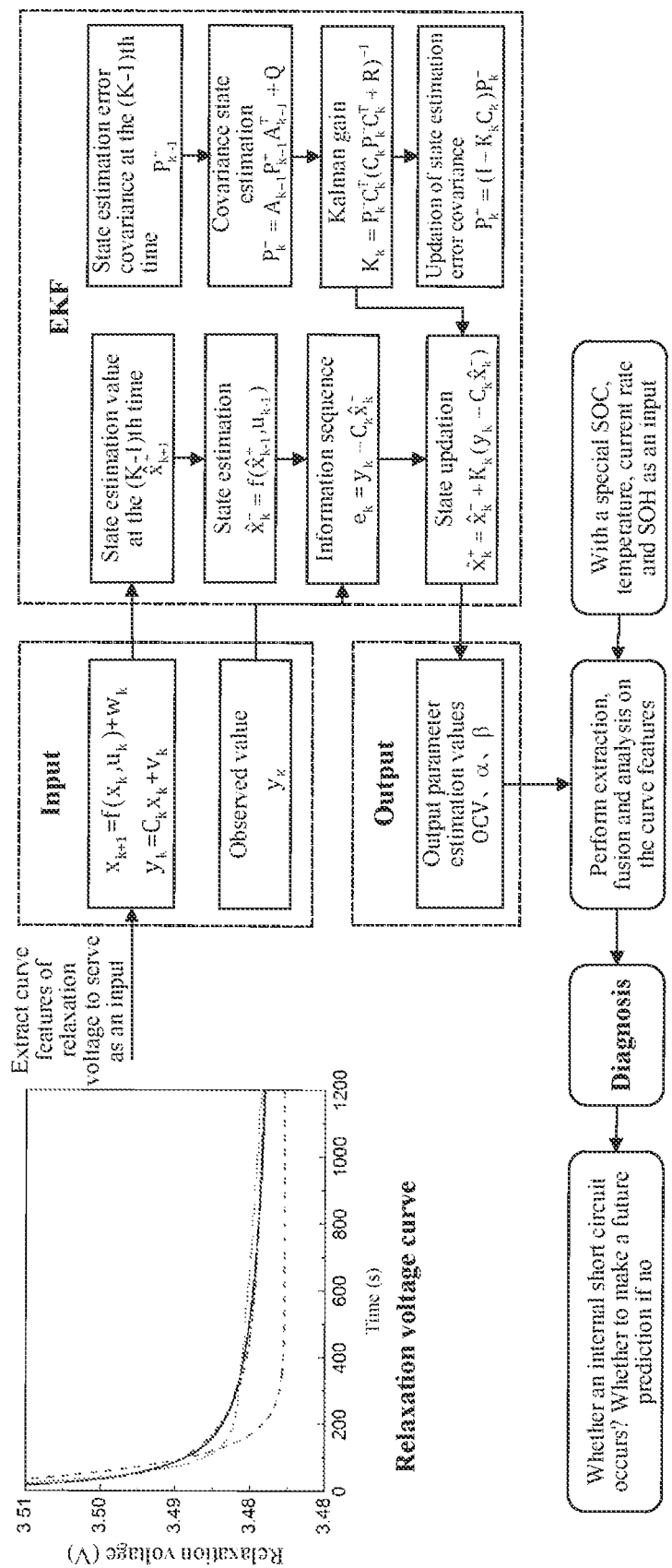
FIG. 5 shows a flow chart of a diagnosis according to an embodiment of the present disclosure.

FIG. 5 shows a flow chart for a diagnosis according to an embodiment of the present disclosure. The EKF algorithm is used to predict the relaxation voltage of the cell in the embodiment. The curve features of the relaxation voltage are extracted from the relaxation voltage curve to serve as an input of the EKF algorithm. Through calculation of the EKF algorithm, a parameter estimation value is output. The parameter estimation value is added to extraction, fusion and analysis on the curve features of the relaxation voltage, thereby implementing the diagnosis on the internal short circuit. The EKF algorithm pertains to the prior art, with the specific process as shown in FIG. 5, and descriptions will not be repeated herein.

Whether the internal short circuit occurs is determined according to the curve features of the relaxation voltage of the cell, specifically as follows: As the features of the relaxation voltage of the cell, i.e., the relaxation voltage difference and the relaxation voltage differential curve, have been acquired in Step 5). The method for determining the internal short circuit according to the relaxation voltage difference may include:

A maximum value $\Delta V_{max}=\Delta V_m$ and a minimum value $\Delta V_{min}=\Delta V_w$ are acquired in the relaxation voltage difference $\Delta V_{k-1}$ through analysis and comparison, where $\Delta V_m$ refers to that an mth group (i.e., an mth and an (m+1)th) of relaxation voltages have the maximum difference, and $\Delta V_w$ refers to a wth group (i.e., a wth and a (w+1)th) of relaxation voltages have the minimum difference. It is determined that the internal short circuit occurs in the mth or (m+1)th cell in the circuit if $\Delta V_{max} \geq 1.3 \Delta V_{min}$. The cell where the internal short circuit occurs is determined by analyzing a magnitude of $\Delta V_{m-1}$ and $\Delta V_{m+1}$. The internal short circuit occurs in the mth cell if $\Delta V_{m-1} > \Delta V_{m+1}$. The internal short circuit occurs in the (m+1)th cell if $V_{m-1} < \Delta V_{m+1}$.

The method for determining the internal short circuit according to the relaxation voltage differential curve may include: a differential curve of a relaxation voltage of each cell is acquired; by calculating a difference between relaxation voltage differentials of the cell at a (k+1)th time and a kth time, and it is specifically determined whether the internal short circuit occurs in the cell as follows: It is determined that, after the completion of charging of the battery, the internal short circuit does not occur in the cell if $$\left(\frac{dV}{dt}\right)_{k+1} - \left(\frac{dV}{dt}\right)_k > 0,$$

and the internal short circuit occurs in the cell if $$\left(\frac{dV}{dt}\right)_{k+1} - \left(\frac{dV}{dt}\right)_k < 0;$$

and it is determined that, after completion of discharging of the battery, the internal short circuit does not occur if $$\left(\frac{dV}{dt}\right)_{k+1} - \left(\frac{dV}{dt}\right)_k < 0,$$

and the internal short circuit occurs in the cell if $$\left(\frac{dV}{dt}\right)_{k+1} - \left(\frac{dV}{dt}\right)_k > 0.$$

7) Extraction, fusion and analysis on the relaxation voltage curve of the cell are performed in combination with a current of the cell before the current is unloaded as well as an SOC, a temperature and an SOH of the cell after the current is unloaded, to diagnose whether the internal short circuit occurs in the cell.

Figure 2:
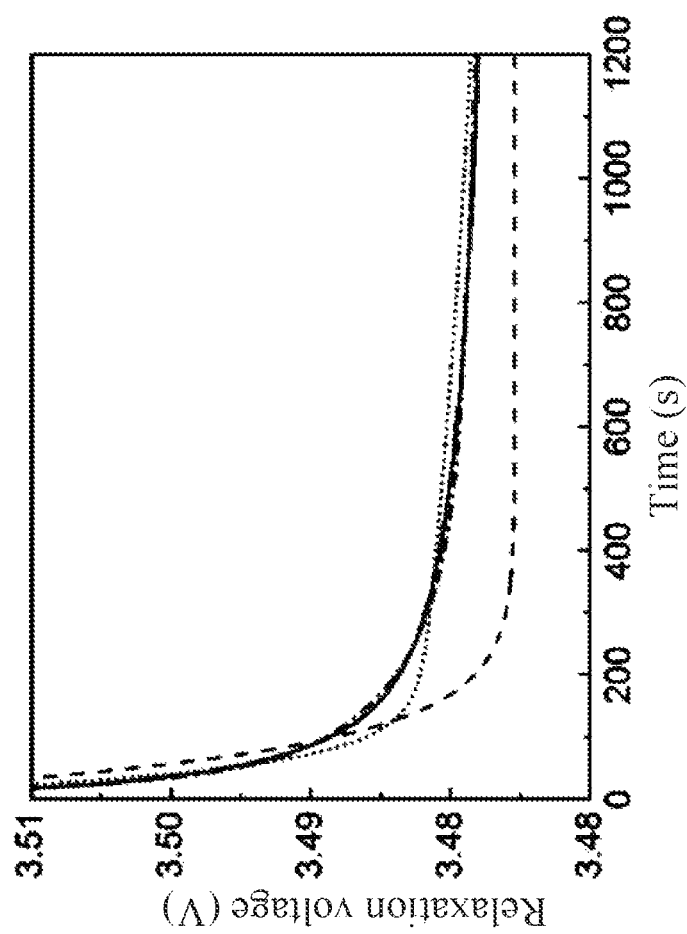
FIG. 2 shows a relaxation voltage curve of a battery according to an embodiment of the present disclosure.

The relaxation voltage curve of the cell obtained in the embodiment of the present disclosure is as shown in FIG. 2. With the use of the method in the embodiment, the cell with the internal short circuit is accurately detected.

The above descriptions are only preferred embodiments of the present disclosure and are not intended to limit the present disclosure. Any descriptions made within the spirit and principle of the present disclosure shall be included in the protection scope of the present disclosure.

What is claimed is:

1. A method for diagnosing an internal short circuit of a battery based on a relaxation voltage, comprising:
   1) acquiring a relaxation voltage curve of each cell in a battery after a current is unloaded, under same conditions of the battery;
   2) extracting features from the relaxation voltage curve of each cell to obtain corresponding curve features; and
   3) determining whether an internal short circuit occurs in the cell according to the curve features, thereby completing diagnosis,
   wherein
   the curve features of the relaxation voltage curve in step 2) comprise a relaxation voltage difference and a relaxation voltage differential curve; and
   the relaxation voltage difference is obtained by performing a subtraction on relaxation voltages between adjacent cells:

$$\Delta V_{k-1} = |V_k - V_{k-1}|, k = 2, 3, 4...,$$

wherein, $\Delta V_{k-1}$ is a difference between a relaxation voltage $V_k$ of a kth cell and a relaxation voltage $V_{k-1}$ of a (k−1)th cell; and whether the internal short circuit occurs in the cell is determined according to the relaxation voltage difference by:

determining, when a corresponding relaxation voltage difference $\Delta V_m$ between an mth cell and an (m+1)th cell is maximum, which is expressed as $\Delta V_{max}=\Delta V_m$, a corresponding relaxation voltage difference $\Delta V_w$ between a wth cell and a (w+1)th cell is minimum, which is expressed as $\Delta V_{min}=\Delta V_w$, and $\Delta V_{max} \geq 1.3 \Delta V_{min}$, that the internal short circuit occurs in the mth or (m+1)th cell in a circuit; and determining, by comparing relaxation voltage differences $\Delta V_{m-1}$ and $\Delta V_{m+1}$, the cell where the internal short circuit occurs, wherein, it is determined that the internal short circuit occurs in the mth cell when $\Delta V_{m-1} > \Delta V_{m+1}$, and the internal short circuit occurs in the (m+1)th cell when $\Delta V_{m-1} < \Delta V_{m+1}$.

2. The method for diagnosing the internal short circuit of the battery based on the relaxation voltage according to claim 1, wherein the same conditions in step 1) refer to a same state of charge (SOC), temperature, current rate and state of health (SOH).

3. The method for diagnosing the internal short circuit of the battery based on the relaxation voltage according to claim 2, wherein the current rate is calculated according to a current flowing through the cell before completion of battery charging/discharging.

4. The method for diagnosing the internal short circuit of the battery based on the relaxation voltage according to claim 1, wherein the relaxation voltage differential curve is obtained by performing a differential calculation on the relaxation voltage curve of each cell, and whether the internal short circuit occurs in the cell is determined according to the relaxation voltage differential curve by:

acquiring differences $$\left(\frac{dV}{dt}\right)_{k+1} \text{ and } \left(\frac{dV}{dt}\right)_k$$

of relaxation voltage differentials of the cell at a (k+1)th time and a kth time;

determining, after the completion of the battery charging, that the internal short circuit does not occur in the cell when $$\left(\frac{dV}{dt}\right)_{k+1} - \left(\frac{dV}{dt}\right)_k > 0,$$

and the internal short circuit occurs in the cell when $$\left(\frac{dV}{dt}\right)_{k+1} - \left(\frac{dV}{dt}\right)_k < 0;$$

and determining, after the completion of the battery discharging, that the internal short circuit does not occur in the cell when $$\left(\frac{dV}{dt}\right)_{k+1} - \left(\frac{dV}{dt}\right)_k < 0,$$

and the internal short circuit occurs in the cell when $$\left(\frac{dV}{dt}\right)_{k+1} - \left(\frac{dV}{dt}\right)_k > 0.$$

5. The method for diagnosing the internal short circuit of the battery based on the relaxation voltage according to claim 1, wherein the relaxation voltage in step 1) refers to a voltage change from a current unloading time to a stable open-circuit state.

6. The method for diagnosing the internal short circuit of the battery based on the relaxation voltage according to claim 1, wherein the method further comprises:

4) predicting a relaxation voltage curve of each cell; and
5) determining, if the internal short circuit does not occur in the cell currently, whether the internal short circuit occurs in the cell in future according to curve features extracted from the predicted relaxation voltage curve of the cell.

7. The method for diagnosing the internal short circuit of the battery based on the relaxation voltage according to claim 6, wherein the relaxation voltage curve is predicted with a nonlinear prediction method in step 4).

8. The method for diagnosing the internal short circuit of the battery based on the relaxation voltage according to claim 7, wherein the nonlinear prediction method comprises an extended Kalman filter (EKF) algorithm and a recursive least squares (RLS) algorithm.

* * * * *